United States Patent
Fattal et al.

(10) Patent No.: US 7,808,005 B1
(45) Date of Patent: Oct. 5, 2010

(54) LIGHT-EMITTING DEVICE WITH PHOTONIC GRATING CONFIGURED FOR EXTRACTING LIGHT FROM LIGHT-EMITTING STRUCTURE

(75) Inventors: David A. Fattal, Mountain View, CA (US); Mihail Sigalas, Palo Alto, CA (US); Raymond G. Beausoleil, Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 480 days.

(21) Appl. No.: 11/789,872

(22) Filed: Apr. 26, 2007

(51) Int. Cl.
 *H01L 27/15* (2006.01)
(52) U.S. Cl. .................. 257/79; 257/E25.032; 438/32
(58) Field of Classification Search .................. 257/79, 257/E25.032; 438/32
See application file for complete search history.

(56) References Cited

U.S. PATENT DOCUMENTS

| | | | |
|---|---|---|---|
| 2002/0119384 A1* | 8/2002 | Koyama et al. | 430/79 |
| 2003/0057417 A1* | 3/2003 | Lee et al. | 257/40 |
| 2003/0071564 A1* | 4/2003 | Hirayama | 313/501 |
| 2004/0188689 A1* | 9/2004 | Shono et al. | 257/79 |

OTHER PUBLICATIONS

Fan, Shanhui, et al., "High Extraction Efficiency of Spontaneous Emission from Slabs of Photonic Crystals", The American Physical Society, vol. 78, No. 1, Apr. 28, 1997, pp. 3294-3297.
Boroditsky, Misha, et al., Spontaneous Emission Extraction and Purcell Enhancement from Thin-Film 2-D Photonic Crystals, Journal of Lightwave Technology, vol. 17, No. 11, Nov. 1999, pp. 2096-2112.
Erchak, Alexei A., "Enhanced coupling to vertical radiation using a two-dimensional photonic crystal in a semiconductor light-emitting diode", Appl. Phys. Lett., vol. 78, No. 5, Jan. 29, 2001, pp. 563-565.

* cited by examiner

*Primary Examiner*—Thao X Le
*Assistant Examiner*—Matthew Gordon

(57) ABSTRACT

Various aspects of the present invention are directed to light-emitting devices including a photonic grating configured to extract spontaneous emission of electromagnetic radiation from a light-emitting structure. In one aspect of the present invention, a light-emitting device includes a light-emitting structure having an active region designed to emit electromagnetic radiation with a selected frequency. The light-emitting device further includes a photonic grating spaced from the active region of the light-emitting structure. The photonic grating is capable of supporting a leaky guided mode that extends within the active region of the light-emitting structure. The leaky guided mode has a mode frequency approximately equal to the selected frequency emitted by the active region and a mode wavevector that is approximately equal to a reciprocal lattice vector of the photonic grating.

16 Claims, 8 Drawing Sheets

LIGHT-EMITTING DEVICE WITH PHOTONIC GRATING CONFIGURED FOR EXTRACTING LIGHT FROM LIGHT-EMITTING STRUCTURE

TECHNICAL FIELD

Embodiments of the present invention generally relate to light-emitting devices including a photonic grating configured to extract spontaneous emission of electromagnetic radiation from a light-emitting structure.

BACKGROUND

Semiconductor light-emitting diodes ("LEDs") are used as light sources in a number of different applications. For example, LEDs are currently employed as light sources in flat-panel displays, fiber-optic systems, and many other applications because they are relatively inexpensive, small, and rugged. FIG. 1 shows one currently available design for an LED 100. The LED 100 includes a p-n semiconductor structure 102 having an n-region 104, a p-region 106, and a depletion region 108 (also known as an active region) formed between the n-region 104 and p-region 106. An electrical contact 110 is formed on the n-region 104 and an electrical contact 112 is formed on the p-region 106. Although, in many designs, the locations of the n-region 104 and p-region 106 may be switched.

As shown in the energy band diagram 200 of FIG. 2, forward biasing the LED 100 by applying a voltage across the electrical contacts 110 and 112 promotes electrons 202 from the conduction band of the n-region 104 and holes 204 from the valence band of the p-region 106 into the depletion region 108. Under forward bias, the valence band electrons 202 can recombine with the conduction band holes 204 in the depletion region 108. In direct band gap materials (e.g., gallium arsenide or gallium nitride), the recombination of a conduction band electron 202 with valence band hole 204 is a radiative energy transition in which electromagnetic radiation hv is emitted with energy equal to the energy band gap $E_g$ of the p-n semiconductor structure 102. As shown in FIG. 1, a portion of electromagnetic radiation generated due to the electron-hole recombination in the depletion region 108 is transmitted through the p-region 106 into free space represented as electromagnetic radiation 114. The electromagnetic radiation 114 emitted from the depletion region 108 is generally incoherent and over a wide angular range. Collimation of the electromagnetic radiation 114 is desirable in certain applications, such as backside illumination in certain types of displays. Typically, collimation of the transmitted electromagnetic radiation 114 from the LED 100 is achieved using external optical elements, such as lenses, which increase the size and complexity of the LED 100.

In addition to lack of collimation, only a portion of the electromagnetic radiation generated in the depletion region 108 is transmitted through the p-region 104 as the electromagnetic radiation 114. A large portion of the electromagnetic radiation generated in the depletion region 108 remains confined within the p-n semiconductor structure 102 due to total internal reflection of the generated electromagnetic radiation at interfaces 116 and 118 between the relatively high refractive index p-n semiconductor structure 102 and the relatively low refractive index surrounding medium. Due to confinement of a large portion of the emitted electromagnetic radiation, typically, only about five percent of the electromagnetic radiation generated in the depletion region 108 is output from the LED 100 as the electromagnetic radiation 114.

One approach for improving the extraction efficiency of a light-emitting device is to form a two-dimensional photonic grating adjacent to an active region of the light-emitting device. For example, a two-dimensional photonic grating formed in a cladding layer of a quantum-well structure has been used to purportedly improve extraction efficiency of electromagnetic radiation emitted from an active region of the quantum-well structure. However, the two-dimensional photonic grating is located in such close proximity to the active region that the probability of non-radiative recombination at the interface between the two-dimensional photonic grating and the quantum well is undesirably high. Another approach for purportedly improving extraction efficiency of a light-emitting device is to place the light-emitting device within a two-dimensional photonic grating and design the photonic grating so that the frequency of light emitted from the light-emitting device falls within the photonic band gap of the photonic grating. Accordingly, designers, manufacturers, and users of light-emitting devices continue to seek improved light-emitting devices having an improved output efficiency and collimation characteristics for use in a multitude of applications.

SUMMARY

Various aspects of the present invention are directed to light-emitting devices including a photonic grating configured to extract spontaneous emission of electromagnetic radiation from a light-emitting structure. In one aspect of the present invention, a light-emitting device includes a light-emitting structure having an active region designed to emit electromagnetic radiation with a selected frequency. The light-emitting device further includes a photonic grating spaced from the active region of the light-emitting structure. The photonic grating is capable of supporting a leaky guided mode that extends within the active region of the light-emitting structure. The leaky guided mode that is excited by the active region has an in-plane wavevector approximately equal to a reciprocal lattice vector of the photonic grating, and a frequency that can be selected by the design of the photonic grating so that the mode frequency is approximately equal to the selected frequency emitted by the active region.

In another aspect of the present invention, a method of generating a beam includes spacing a photonic grating from an active region of a light-emitting structure. The method further includes coupling electromagnetic radiation emitted from the active region to at least one leaky guided mode of the photonic grating. The method also includes coupling the at least one leaking guided mode to at least one radiative mode having a wavevector substantially perpendicular to a plane of periodicity of the photonic grating.

BRIEF DESCRIPTION OF THE DRAWINGS

The drawings illustrate various embodiments of the present invention, wherein like reference numerals refer to like or similar elements in different views or embodiments shown in the drawings.

DETAILED DESCRIPTION OF VARIOUS EMBODIMENTS

Various embodiments of the present invention are directed to light-emitting devices including a photonic grating configured to promote and extract spontaneous emission of electromagnetic radiation from a light-emitting structure. The disclosed light-emitting devices and apparatuses include a photonic grating configured to promote spontaneous emission of electromagnetic radiation from a light-emitting structure (e.g., an LED), efficiently extract the spontaneous emission of electromagnetic radiation, and output the extracted spontaneous emission of electromagnetic radiation as a substantially collimated beam, while the photonic grating may be spaced a sufficient distance from the light-emitting structure to reduce the probability of non-radiative transitions. The thickness of the photonic grating is selected so that a leaky guided mode supported by the photonic grating extends within the active region to stimulate spontaneous emission at a selected frequency and a selected wavevector that couples to a vertical radiative mode.

Figure 1:
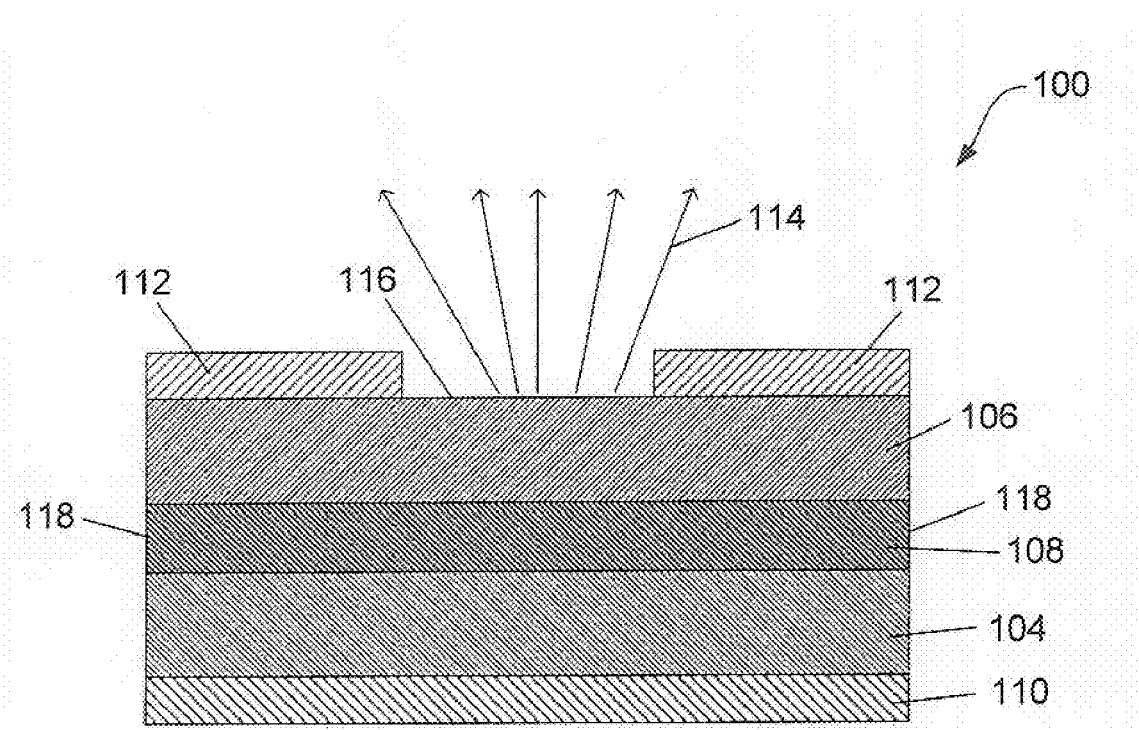
FIG. 1 is a schematic side cross-sectional view of an LED according to one currently available design.
Figure 2:
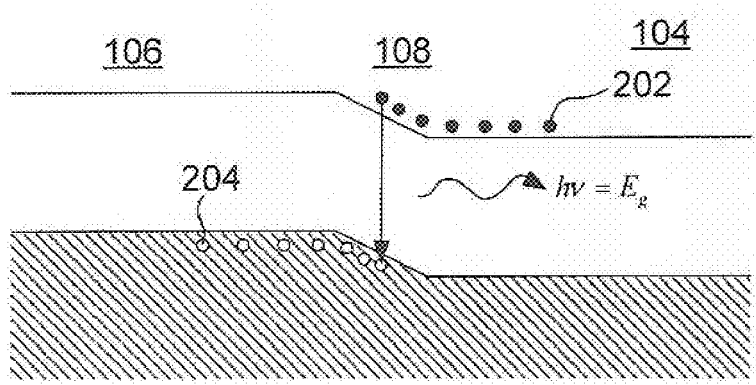
FIG. 2 is an energy band diagram for the LED shown in FIG. 1.
Figure 3:
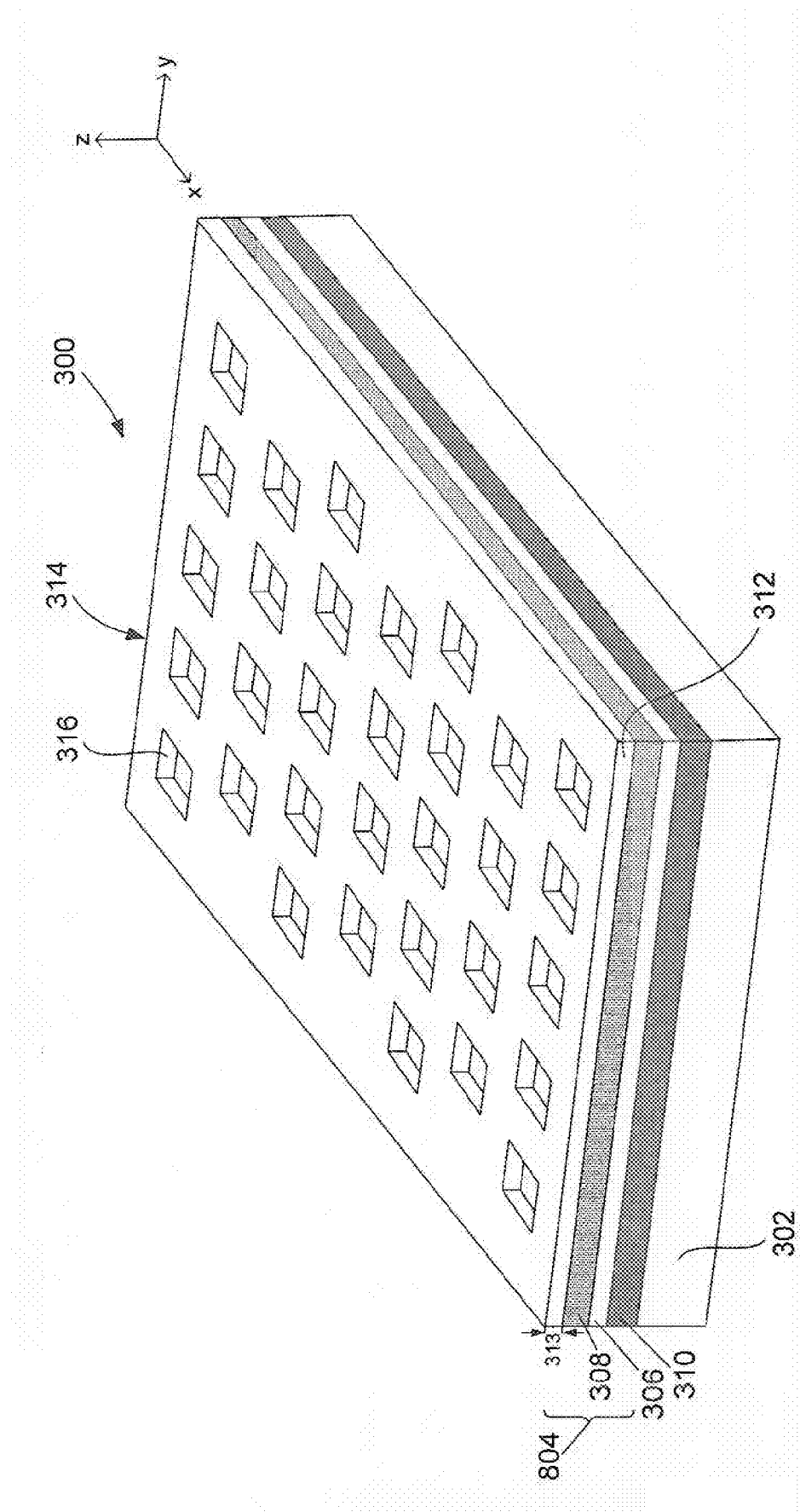
FIG. 3 is a schematic isometric view of a light-emitting device according to one embodiment of the present invention.
Figure 4:
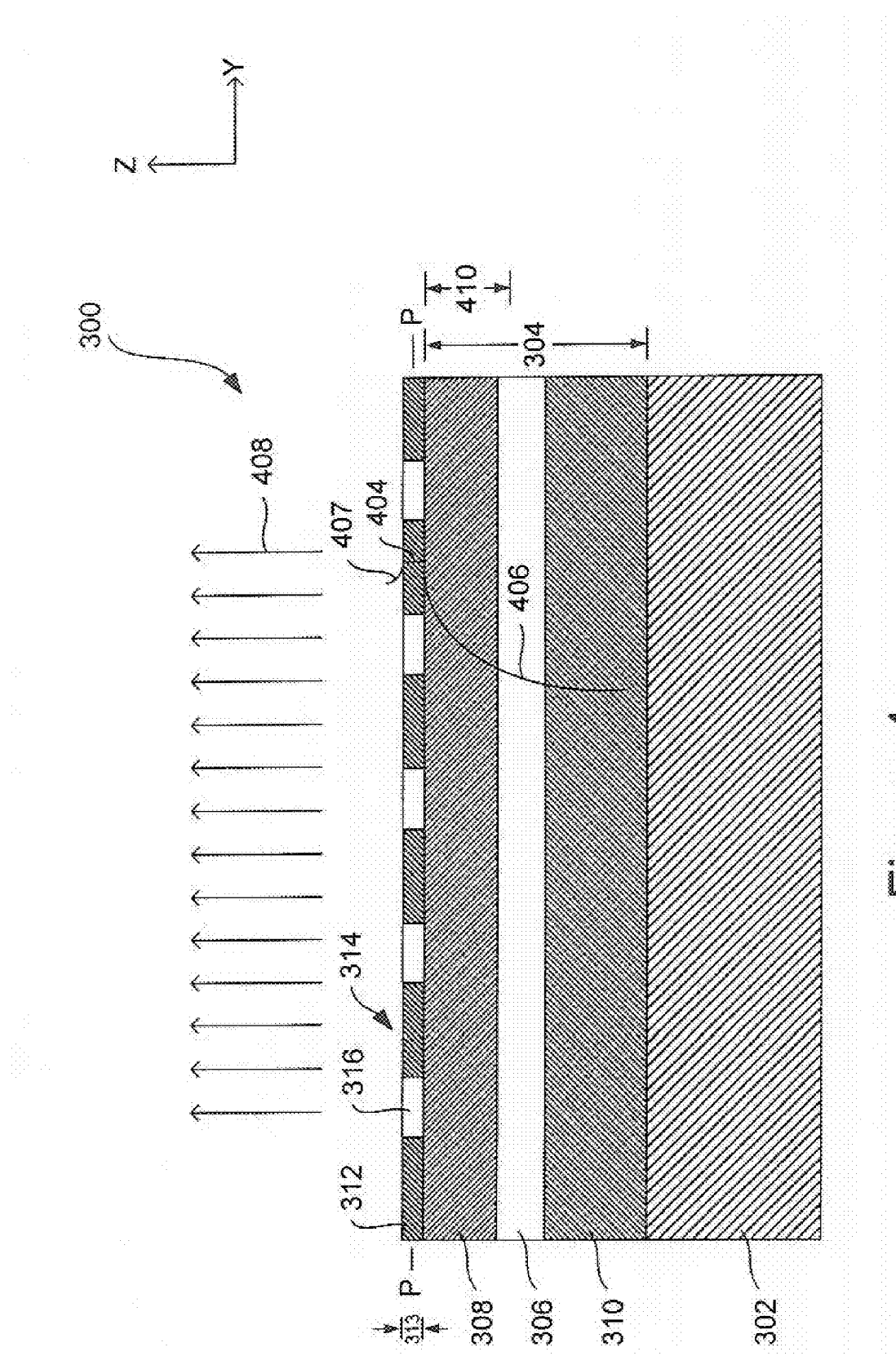
FIG. 4 is a schematic cross-sectional view of the light-emitting device shown in FIG. 3 along with a profile of a leaky guided mode extending into the light-emitting device.

FIGS. 3 and 4 show a light-emitting device 300 according to one embodiment of the present invention. The light-emitting device 300 includes a substrate 302 on which a light-emitting structure 304 is formed. In the illustrated embodiment, the light-emitting structure 304 is an LED that includes an active region 306 formed between a p-region 308 and an n-region 310. The LED may be formed from any number of well-known inorganic and organic semiconductor LED structures, such as gallium arsenide, gallium nitride, indium phosphide, organo-metallic chealates, and conjugated dendrimers. However, in other embodiments of the present invention, the light-emitting structure 304 may be a quantum-well ("QW") structure or another suitable light-emitting structure.

A photonic grating 312 is formed over the light-emitting structure 304. The photonic grating 312 has a subwavelength thickness 313 of, for example, about 10 nm to about 200 nm. The photonic grating 312 includes a periodic array 314 of holes 316, with each of the holes 316 having a different dielectric constant than that of the surrounding photonic grating 312. In certain embodiments of the present invention, the holes 316 may be filled with a suitable material having a dielectric constant that is greater than or less than that of the surrounding material of the photonic grating 312. In the illustrated embodiment shown in FIGS. 3 and 4, the photonic grating 312 is a two-dimensional photonic grating having a plane of periodicity P (FIG. 4). However, in other embodiments of the present invention, the photonic grating 312 may be a one-dimensional photonic grating. The holes 316 of the periodic array 314 are shown distributed in a hexagonal arrangement, with a lattice parameter a. Generally, the magnitude of the lattice parameter a is approximately the same as the wavelength of electromagnetic radiation that the active region 306 of the light-emitting structure 304 is designed to emit. However, it should be emphasized that the particular configuration for the periodic array 314 may be varied from the illustrated embodiment depending upon the desired photonic band structure for the photonic grating 312.

Figure 5:
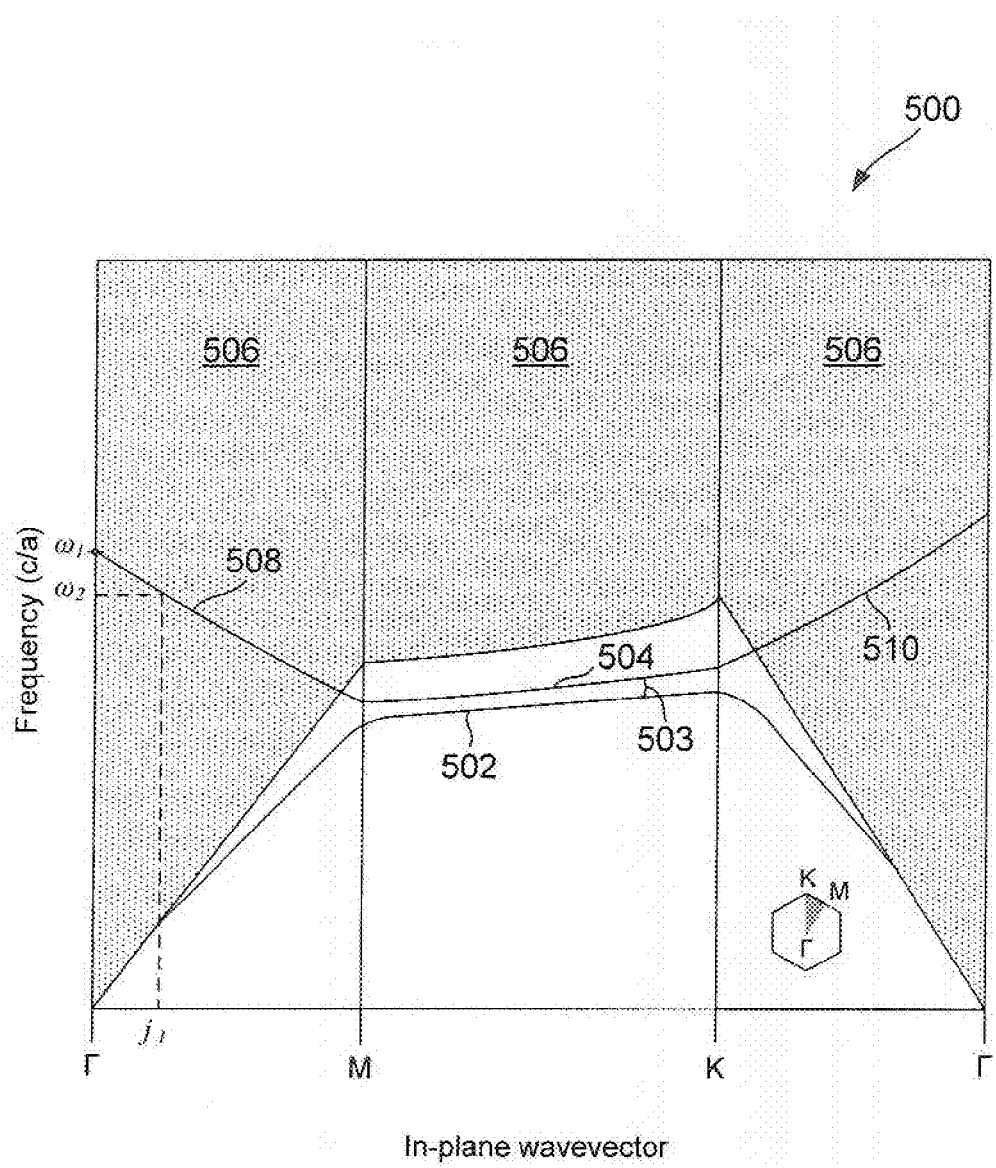
FIG. 5 is a photonic band diagram for the photonic grating of the light-emitting device shown in FIG. 3.

As discussed briefly above, the photonic grating 312 has a characteristic photonic band structure for electromagnetic radiation that propagates in the plane of periodicity P, which depends upon the size, spacing, and geometry of the holes 316. Thus, the photonic grating 312 may be viewed as a photonic crystal for electromagnetic radiation propagating in the plane of periodicity P. FIG. 5 shows a photonic band diagram 500 for the photonic grating 312 shown in FIGS. 3 and 4, with the irreducible Brillouin zone superimposed on the photonic band diagram 500. The vertical axis represents the frequency of an electromagnetic wave and the horizontal axis represents the in-plane wavevector, which is the wavevector of the electromagnetic wave in the plane P of the photonic grating 312. The photonic band diagram 500 includes a valence band 502 and a conduction band 504. It is noted that there are typically multiple higher order conduction bands, but in the interest of simplicity and clarity only the conduction band 504 is shown in FIG. 5. The valence band 502 and the conduction band 504 are separated by a photonic band gap 503 in which no modes may propagate within the photonic grating 312.

Because the photonic grating 312 has a higher dielectric constant than the surrounding air and the light-emitting structure 304, the valence band 502 and conduction band 504 each comprises a continuum of guided modes that the photonic grating 312 is capable of supporting. The guided modes are electromagnetic waves that are confined within the photonic grating 312 due to total internal reflection at a boundary between the photonic grating 312 and the light-emitting structure 304 and at a boundary between the photonic grating 312 and surrounding air or other medium. Due to the finite thickness 313 of the photonic grating 312, the valence band 502 and conduction band 504 cannot be divided into transverse magnetic ("TM") and transverse electric ("TE") guided modes. Instead, the valence band 502 and the conduction band 504 each include TM and TE guided modes. A mode is a point along the valence band 502 or the conduction band 504 that includes a specific mode frequency, a corresponding mode wavevector, and a specific electric field polarization direction.

With continued reference to FIG. 5, the photonic band diagram 500 also depicts a light cone 506 represented by a shaded region. The light cone 506 of the photonic band diagram 500 represents all possible radiative modes. Modes of the valence band 502 and conduction band 504 that lie beneath the light cone 508 are confined within the photonic grating 312 and cannot couple to any radiating mode because such guided modes cannot phase match with the radiative modes. Modes of the valence band 502 and the conduction band 504 that lie within the light cone 506 are capable of coupling to radiative modes so that electromagnetic radiation may be emitted from the photonic grating 312. For example, sections 508 and 510 of the conduction band 504 each includes a continuum of leaky guided modes that are capable of coupling to radiative modes within the light cone 508. As will be discussed in more detail below, a radiative mode is a plane wave of electromagnetic radiation with a wavevector imposed by matching the in-plane wavevector of a particular leaky guided mode to the radiative mode. In order to conserve energy and momentum, the frequency and in-plane wavevector of the radiative mode equals the frequency and in-plane wavevector of the particular leaky guided mode. Accordingly; by properly selecting the frequency of electromagnetic radiation that the light-emitting structure 304 emits, the angle at which the radiative mode is emitted from the photonic grating 312 may be controlled.

The operation of the light-emitting device 300 is best understood with reference to FIG. 4 in conjunction with the photonic band diagram 500 shown in FIG. 5. During operation, the light-emitting structure 304 is forward biased using a voltage source (not shown) so that electromagnetic radiation 402 is emitted from the active region 306 as a result of the recombination of electron-hole pairs. For example, the photonic grating 312 may function as a first electrode and a second electrode (not shown) may be formed on the back surface of the substrate 302. The light-emitting structure 304 is designed so that the electromagnetic radiation 402 has a narrow frequency range, with the dominant frequency being at about $\omega_1$.

As briefly discussed above, the thickness 313 of the photonic grating 312 predominately controls the extent that the leaky guided mode at the frequency $\omega_1$ extends into the light-emitting structure 304. As the thickness 313 of the photonic grating 312 decreases, the distance that the leaky guided mode extends within the light-emitting structure 304 increases. As shown in FIG. 4, the leaky guided mode exhibits a maximum intensity within the photonic grating 312 and the intensity decreases with distance into the light-emitting structure 304. The leaky guided mode extends to at least within the active region 306. Moreover, in certain embodiments of the present invention, the leaky guided mode may extend into the n-region 310. Accordingly, when the thickness 313 of the photonic grating 312 has a subwavelength dimension (i.e., a thickness less than the wavelength of electromagnetic radiation 402 emitted by the active region 306), the photonic grating 312 supports a leaky guided mode that extends within a substantial portion of the active region 306 of the light-emitting structure 304. As shown in FIG. 4, the leaky guided mode includes a guided portion 404 within the photonic grating 312 and a leaky evanescent portion 406 that extends at least into the active region 306 of the light-emitting structure 304. The leaky guided mode also includes a leaky evanescent portion 407 that extends into free-space away from the photonic grating 312 and decays faster than that of the leaky evanescent portion 406. In certain embodiments of the present invention, the leaky evanescent portion 406 may extend from an interface between the photonic grating 312 and the p-region 308 a distance of about 0.25 μm to about 3 μm.

The presence of the leaky guided mode within the active region 306 promotes spontaneous emission of electromagnetic radiation 402 at predominately the frequency $\omega_1$ and with a wavevector substantially equal to a reciprocal lattice vector of the photonic grating 312, which is plotted at the Γ point on the photonic band diagram 500 of FIG. 5. For example, in the illustrated embodiment shown in FIGS. 3 and 4, the reciprocal lattice vector of the periodic array 314 is equal to $2\pi/a$. Due to this quantum-electrodymanic effect, a substantially fraction of the electromagnetic radiation 402 is emitted from the active region 306 at the frequency $\omega_1$ and with an in-plane wavevector equal to a reciprocal lattice vector of the photonic grating 312. Thus, the active region 306 emits the electromagnetic radiation 402 as if it is located within the photonic grating 312 and couples to the leaky guided mode at a frequency $\omega_1$ and with an in-plane wavevector equal to the reciprocal lattice vector of the photonic grating 312. The leaky guided mode at the frequency $\omega_1$ couples into radiative modes that have an in-plane wavevector of about zero. Accordingly, the radiative modes, represented by emission 408 are emitted at an angle of approximately zero degrees relative to the Z-axis (i.e., substantially vertical emission).

Although substantially all of the electromagnetic radiation 402 is emitted at the frequency $\omega_1$, a portion of the electromagnetic radiation 402 may exhibit frequencies slightly smaller or larger than the frequency $\omega_1$. The portion of the electromagnetic radiation 402, with a frequency that deviates from the frequency $\omega_1$, couples to radiative modes that are also determined by phase matching of a particular leaky guided mode to a particular radiative mode. For example, as shown in FIG. 5, electromagnetic radiation 402 emitted at the frequency $\omega_2$ couples to a leaky guided mode of the conduction band 504 having an in-plane wavevector $k_2$. The leaky guided mode at the frequency $\omega_2$ and the wavevector $k_2$ couples to a radiative mode also having an in-plane wavevector of $k_2$. Consequently, the radiative mode at the frequency $\omega_2$ has an angle of emission that has a small, non-zero angle relative to the Z-axis. Regardless of the particular amount of frequency spreading of the electromagnetic radiation 402, the electromagnetic radiation 408 is emitted from the photonic grating 312 as a substantially collimated beam or a beam with a small divergence angle relative to the Z-axis.

Because the leaky guided mode at the frequency $\omega_1$ and the in-plane wavevector equal to the reciprocal lattice vector of the photonic grating 312 extends within the active region 306 to stimulate spontaneous emission from the active region 306 at the frequency $\omega_1$ and with an in-plane wavevector equal to the reciprocal lattice vector of the photonic grating 312, the active region 306 may be spaced from the photonic grating 312 a distance 410 of, for example, about 1 μm or more, and more particularly about 1 μm to about 2 μm. Spacing the photonic grating 312 a sufficient distance from the active region 306 reduces the probability of non-radiative recombination of electron-hole pairs at the interface between the photonic grating 312 and the light-emitting structure 304 that can deleteriously reduce the efficiency of the light-emitting device 300. Additionally, the photonic grating 312 enables efficiently extracting a significant portion of the electromagnetic radiation 402 emitted by the active region 306. In some configurations for the photonic grating 312, the photonic grating 312 is designed so that approximately one-hundred percent of the electromagnetic radiation 402 may be extracted from the active region 306.

The use of the photonic grating 312 to support a leaky guided mode that extends into a light-emitting structure 304 is well-suited to improve the operational lifetime of an OLED. The internal quantum efficiency of conventional OLEDs generally degrades over time due to non-radiative recombination centers being generated with use. With use, the probability of electron-hole pairs recombining at non-radiative recombination centers increases so that the internal quantum efficiency of the OLED decreases. By designing the photonic grating 312 to support a leaky guided mode that extends into the active region 306 of an OLED, the leaky guided mode promotes spontaneous radiative emission at the frequency $\omega_1$ over the non-radiative recombination of electron-hole pairs.

Figure 6:
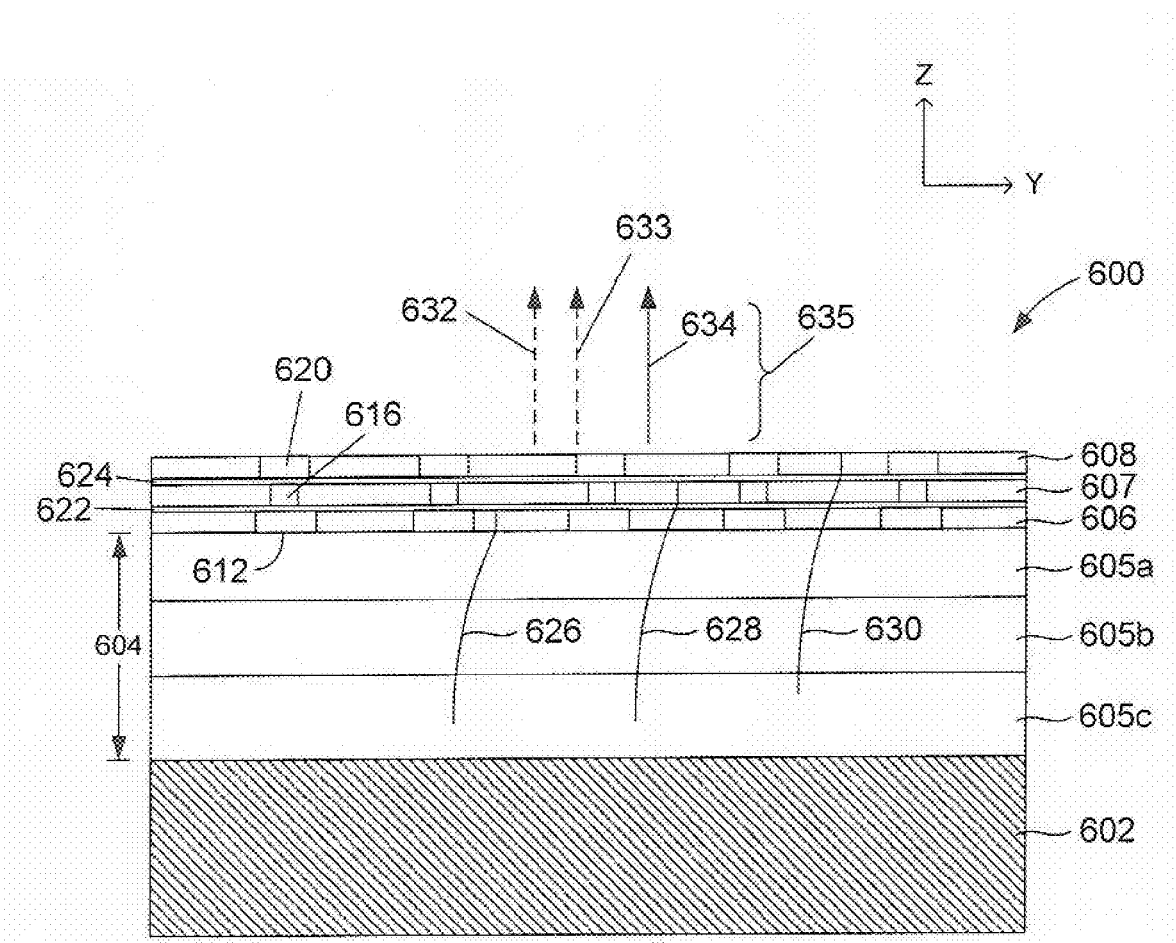
FIG. 6 is a schematic side cross-sectional view of a light-emitting device including multiple, spaced photonic gratings according to another embodiment of the present invention.
Figure 7:
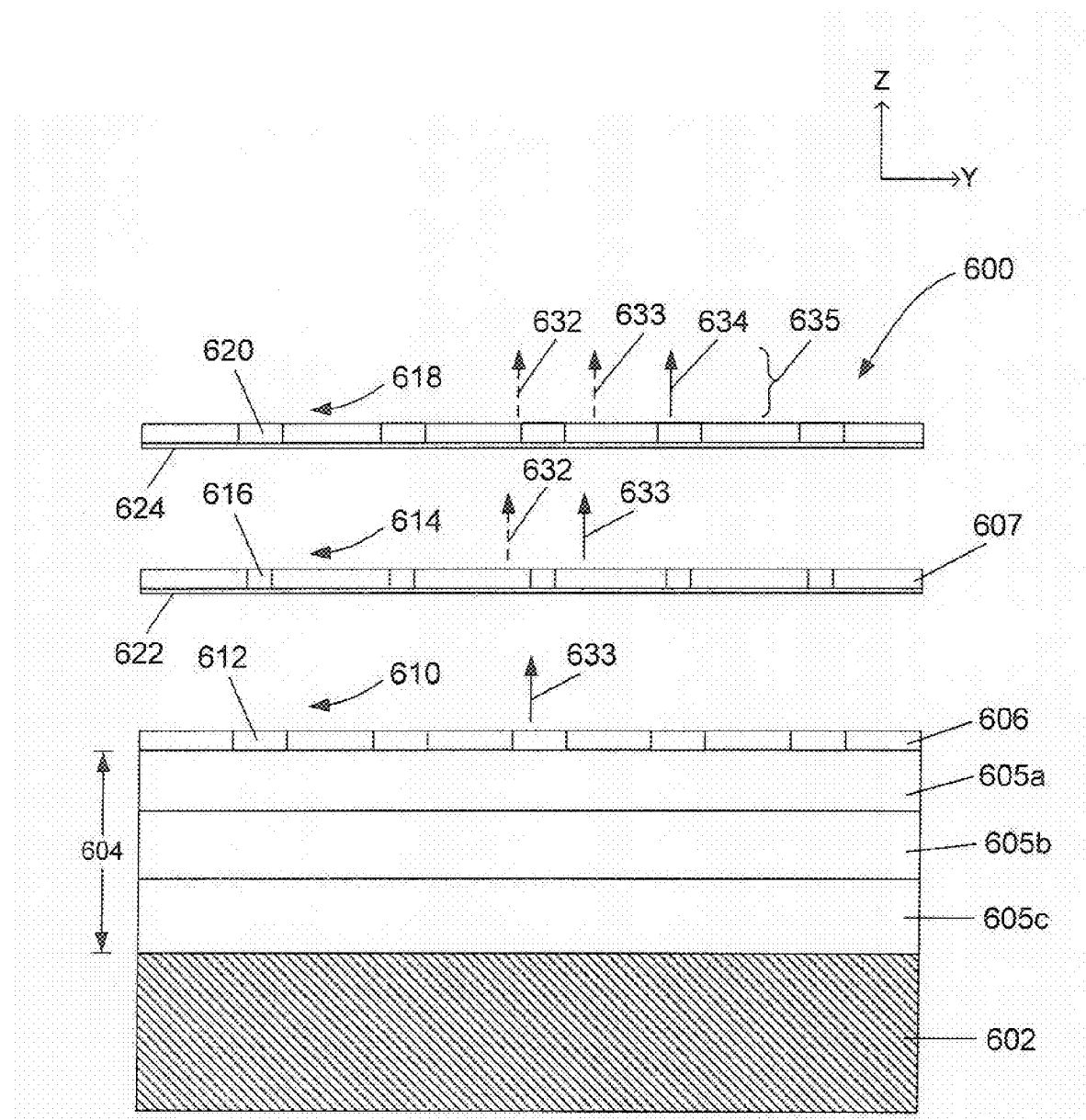
FIG. 7 is a schematic, exploded, side cross-sectional view of the light-emitting device shown in FIG. 6 during operation.

The ability of a leaky guided mode of a photonic grating to stimulate emission from a light emitter may be utilized by stacking multiple photonic gratings, each of which is designed to stimulate emission at a selected frequency from a corresponding light emitter. FIGS. 6 and 7 show a light-emitting device 600 according to another embodiment of the present invention. The light-emitting device 600 includes a substrate 602 on which a light-emitting structure 604 is formed. The light-emitting structure 604 includes a first light-emitting structure 605a, a second light-emitting structure 605b, and a third light-emitting structure 605c configured to emit electromagnetic radiation at corresponding first, second, and third frequencies $\omega_1$, $\omega_2$, and $\omega_3$. For example, each of the light-emitting structures 605a-605c may be individual light-emitting diodes or QW structures designed to emit electromagnetic radiation at the corresponding first, second, and third frequencies $\omega_1$, $\omega_2$, and $\omega_3$.

First, second, and third photonic gratings 606-608 are formed over the light-emitting structure 604. Each of the photonic gratings 606-608 is configured to extract electromagnetic radiation emitted by the light-emitting structure 604 at a different selected frequency. The first photonic grating 606 includes a periodic array 610 of holes 612 arranged so that the photonic band structure of the first photonic grating 606 exhibits a first leaky guided mode 626 at a first frequency $\omega_1$ and an in-plane wavevector equal to a reciprocal lattice vector of the first photonic grating 606. The second photonic grating 607 includes a periodic array 614 of holes 616 arranged so that the photonic band structure of the second photonic grating 607 exhibits a second leaky guided mode 628 at a second frequency $\omega_2$ and an in-plane wavevector equal to a reciprocal lattice vector of the second photonic grating 607. The third photonic grating 608 includes a periodic array 618 of holes 620 arranged so that the photonic band structure of the third photonic grating 608 exhibits a third leaky guided mode 630 at a third frequency $\omega_3$ and an in-plane wavevector equal to a reciprocal lattice vector of the third photonic grating 608. The photonic band structure of each of the photonic gratings 606-608 may be controlled by varying the spacing, size, geometry of the holes that form the periodic arrays 610, 614, and 618. Thus, the frequency of the first, second, and third leaky guided modes 626, 628, and 630 may be controlled by the configuration of the corresponding photonic grating 606-608. A low-refractive index layer 622 may be positioned between the photonic grating 606 and the photonic grating 607 that have a relatively higher refractive index, and a low-refractive index layer 624 may be positioned between the photonic grating 607 and the photonic grating 608 so that the second and third leaky guided modes may be supported by the photonic gratings 607 and 608. In certain embodiments of the present invention, the low-refractive index layer 622 may fill the holes 612 of the photonic grating 606 and the low-refractive index layer 624 may fill the holes 616 of the photonic grating 607. Suitable materials for the low-refractive index layers 622 and 624 include, but are not limited to, silicon dioxide or another suitable low-refractive index material.

Each of the photonic gratings 606-608 has a thickness selected so that the leaky guided mode thereof extends substantially into the light-emitting structure 604 to promote spontaneous emission of electromagnetic radiation from an active region (not shown) of the light-emitting structure 604 at one of the first, second, and third frequencies $\omega_1$, $\omega_2$, and $\omega_3$. Thus, the first photonic grating 606 is configured to promote spontaneous emission at and extract electromagnetic radiation at the first frequency $\omega_1$, the second photonic grating 607 is configured to promote spontaneous emission at and extract electromagnetic radiation at the second frequency $\omega_2$, and the third photonic grating 608 is configured to promote spontaneous emission at and extract electromagnetic radiation at the third frequency $\omega_3$. It is noted that the leaky guided modes 628 and 630 are still capable of stimulating emission from the corresponding active regions (not shown) of the light-emitting structures 605b and 605c despite being spaced from the light-emitting structures 605b and 605c.

During operation, the light-emitting structures 605a-605c emit corresponding electromagnetic radiation at the first, second, and third frequencies $\omega_1$, $\omega_2$, and $\omega_3$. With reference to FIG. 6, electromagnetic radiation at the first frequency $\omega_1$ is coupled to the first leaky guided mode 626 that extends into an active region (not shown) of the light-emitting structure 605a, electromagnetic radiation at the second frequency $\omega_2$ is coupled to the second leaky guided mode 628 that also extends into an active region (not shown) of the light-emitting structure 605b, and electromagnetic radiation at the third frequency $\omega_3$ is coupled to the third leaky guided mode 630 that extends into an active region (not shown) of the light-emitting structure 605c. In a manner similar to the light-emitting device 300, each of the leaky guided modes 626, 628, and 630 promotes spontaneous emission of electromagnetic radiation from corresponding light-emitting structures 605a-605c at the first, second, and third frequencies $\omega_1$, $\omega_2$, and $\omega_3$ and further with an in-plane wavevector equal to the reciprocal lattice vector of the corresponding photonic grating 606-608.

As shown best in FIG. 7, a substantially collimated beam 632 at the first frequency $\omega_1$ is emitted from the first photonic grating 606 and transmitted through the second and third photonic gratings 607 and 608 due to the frequency $\omega_1$ of the substantially collimated beam 632 being off resonance from the resonance conditions of the second and third photonic gratings 607 and 608. A substantially collimated beam 633 at the second frequency $\omega_2$ is emitted from the second photonic grating 607 and transmitted through the third photonic grating 608 due to the frequency $\omega_2$ of the substantially collimated beam 633 being off resonance from the resonance condition of the third photonic grating 608. A substantially collimated beam 634 at the third frequency $\omega_3$ is emitted from the third photonic grating 608, and the substantially collimated beams 632-634 form a substantially collimated beam 635 that has a selected color defined by the combination of the colors of the substantially collimated beams 632-634. Therefore, the color of the substantially collimated beam 635 may be controlled by the design of the photonic band structure of the photonic gratings 606-608 and, consequently, the frequency of the corresponding substantially collimated beams 632-634 emitted therefrom. In certain embodiments of the present invention, the colors of the substantially collimated beams 632-634 are selected so that the substantially collimated beam 635 appears as a white-light beam.

Figure 8:
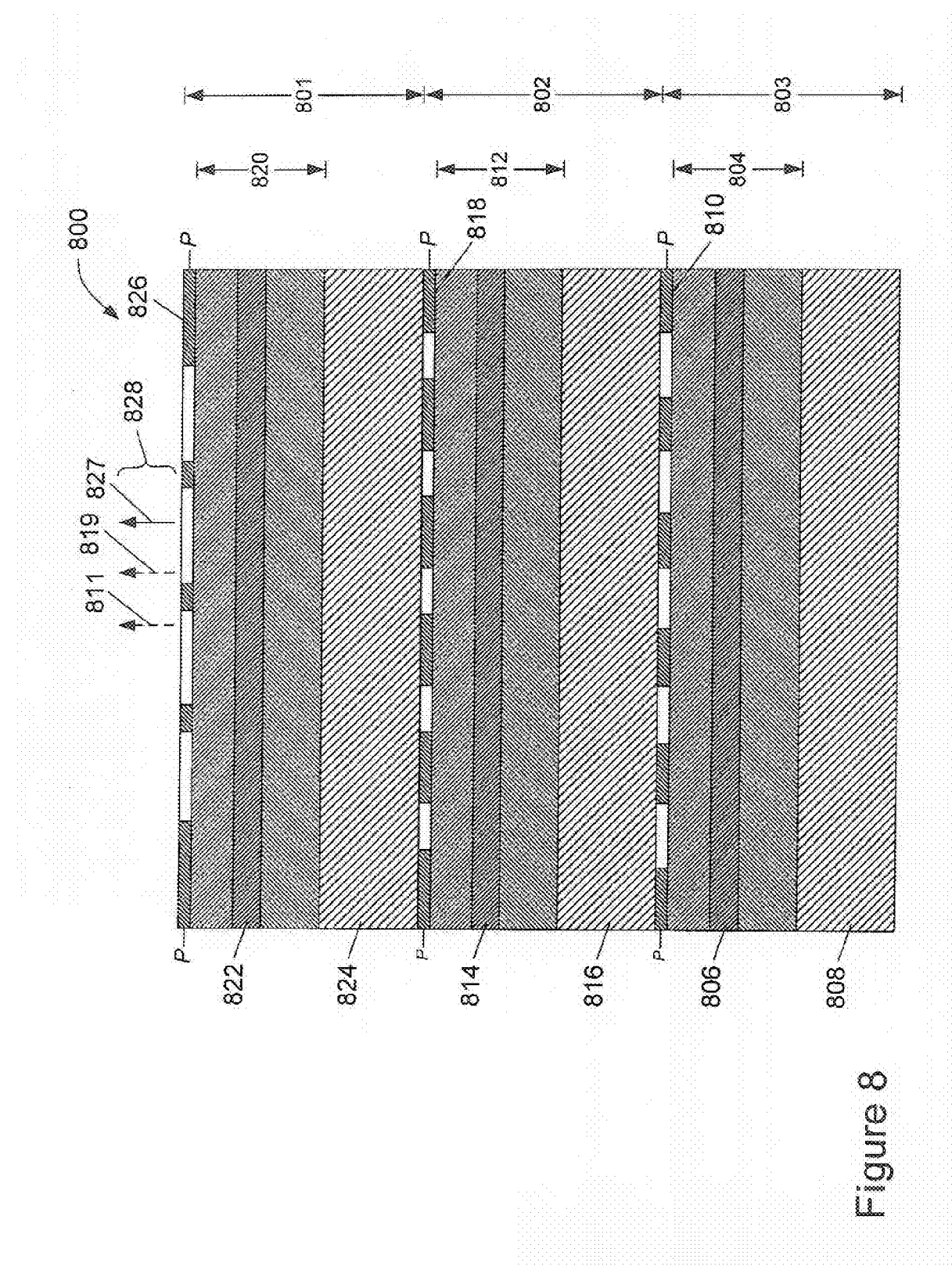
FIG. 8 is a schematic side cross-sectional view of a light-emitting apparatus including a number of light-emitting devices configured to function as the light-emitting device shown in FIG. 3 according to yet another embodiment of the present invention.
Figure 9:
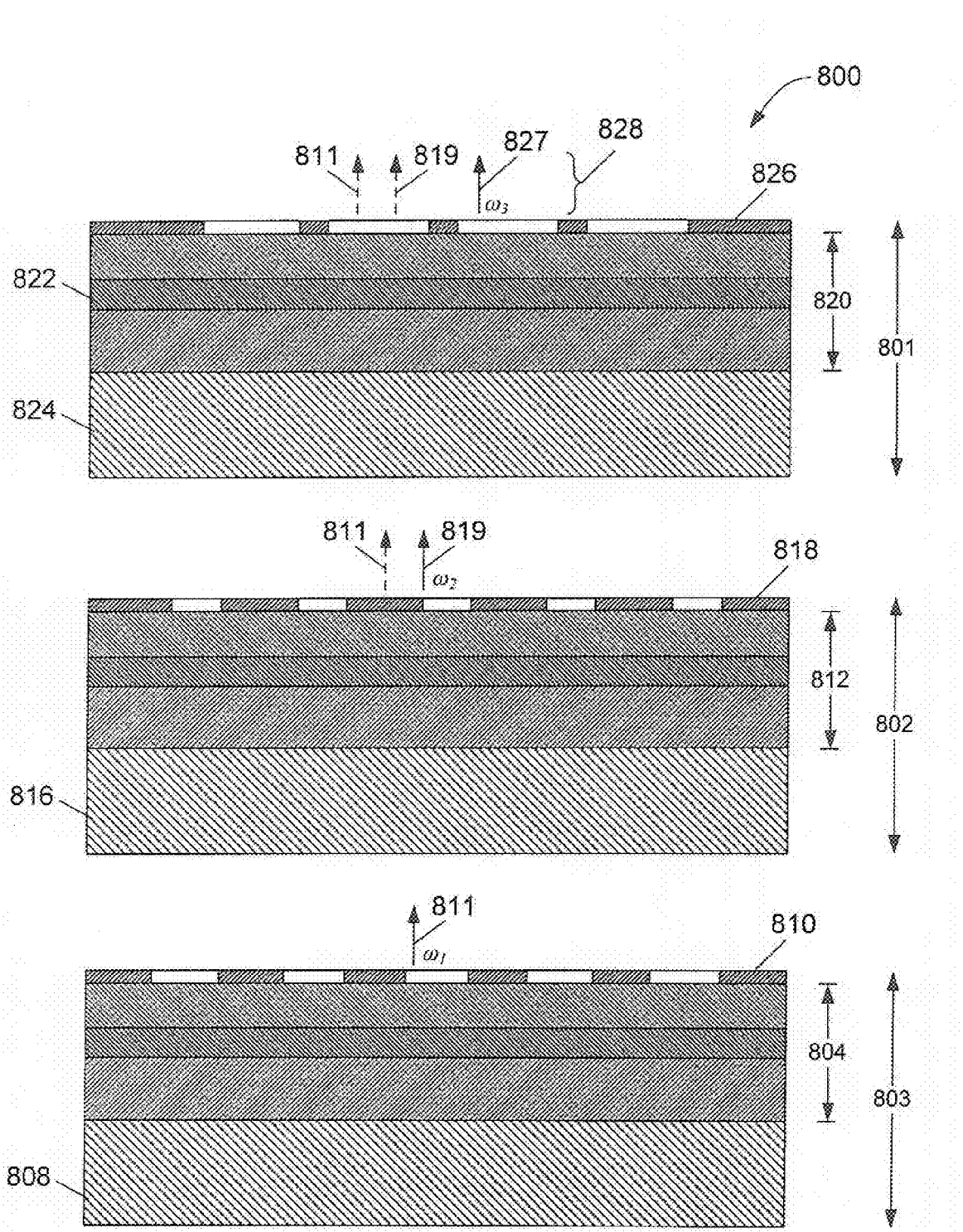
FIG. 9 is a schematic, exploded, side cross-sectional view of the light-emitting apparatus shown in FIG. 8 during operation.

FIGS. 8 and 9 show a light-emitting apparatus 800 that includes a number of light-emitting devices 801-803 according to yet another embodiment of the present invention. Each of the light-emitting devices 801-803 is configured to function as the light-emitting device 300, previously described with respect to FIG. 3, to emit a substantially collimated beam having a selected dominant frequency. The light-emitting device 801 includes a light-emitting structure 804 (e.g., an LED or QW structure), with an active region 806, formed on a substrate 808. The light-emitting device 801 further includes a photonic grating 810 configured so that a leaky guided mode thereof extends into the active region 806 to promote spontaneous emission of electromagnetic radiation from the active region 806 at a frequency $\omega_1$ and a wavevector equal to the reciprocal lattice vector of the photonic grating 810 and extract the electromagnetic radiation at the frequency $\omega_1$. The light-emitting device 802 includes a light-emitting structure 812 (e.g., an LED or QW structure), with an active region 814, formed on a substrate 816. The light-emitting device 802 further includes a photonic grating 818 configured so that a leaky guided mode thereof extends into the active region 814 to promote spontaneous emission of electromagnetic radiation from the active region 814 at a frequency $\omega_2$ and a wavevector equal to the reciprocal lattice vector of the photonic grating 818 and extract the electromagnetic radiation at the frequency $\omega_2$. The light-emitting device 803 includes a light-emitting structure 820 (e.g., an LED or QW structure), with an active region 822 formed on a substrate 824. The light-emitting device 803 further includes a photonic grating 826 configured so that a leaky guided mode thereof extends into the active region 822 to promote spontaneous emission of electromagnetic radiation from the active region 822 at a frequency $\omega_3$ and a wavevector equal to the reciprocal lattice vector of the photonic grating 826 and extract the electromagnetic radiation at the frequency $\omega_3$.

As best shown in FIG. 9, during operation, a substantially collimated beam 811 is emitted from the photonic grating 810 of the light-emitting device 801, and the substantially collimated beam 811 is transmitted through the light-emitting devices 802 and 803. A substantially collimated beam 819 is emitted from the photonic grating 818 of the light-emitting device 802, and the substantially collimated beam 819 is transmitted through the light-emitting device 803. Additionally, a substantially collimated beam 827 is emitted from the photonic grating 826 of the light-emitting device 803. The substantially collimated beams 811, 819, and 826 define a substantially collimated beam 828. As with the light-emitting device 600 shown in FIG. 6, the color of the substantially collimated beam 828 may be controlled by selection of the frequencies $\omega_1$, $\omega_2$, and $\omega_3$ of the individual substantially collimated beams 811, 819, and 826 that form the substantially collimated beam 828. As previously described, the frequencies $\omega_1$, $\omega_2$, and $\omega_3$ are a function of the frequency of the electromagnetic radiation emitted by corresponding light-emitting structures 804, 812, and 820.

Although the present invention has been described in terms of particular embodiments, it is not intended that the present invention be limited to these embodiments. Modifications within the spirit of the present invention will be apparent to those skilled in the art. For example, in other embodiments of the present invention, the hole shape and/or hole depth in the photonic gratings may vary from the illustrated embodiments. For example, the holes may have a circular geometry and the holes may only partially extend through the thickness of the photonic grating. In yet another embodiment of the present invention, the photonic grating may be defined in a portion of the underlying light-emitting structure. For example, with reference to FIGS. 3 and 4, the photonic grating 312 may be integrally formed in a portion of the p-region 308 of the light-emitting structure 304 as opposed to a separate layer formed on the light-emitting structure 304.

The foregoing description, for purposes of explanation, used specific nomenclature to provide a thorough understanding of the present invention. However, it will be apparent to one skilled in the art that the specific details are not required in order to practice the present invention. The foregoing descriptions of specific embodiments of the present invention are presented for purposes of illustration and description. They are not intended to be exhaustive of or to limit the present invention to the precise forms disclosed. Many modifications and variations are possible in view of the above teachings. The embodiments are shown and described in order to best explain the principles of the present invention and its practical applications, to thereby enable others skilled in the art to best utilize the present invention and various embodiments with various modifications as are suited to the particular use contemplated. It is intended that the scope of the present invention be defined by the claims and their equivalents:

The invention claimed is:
1. A light-emitting device, comprising:
  a light-emitting structure including an active region designed to emit electromagnetic radiation having a first selected frequency;
  a first photonic grating spaced from the active region and capable of supporting a first leaky guided mode that extends within the active region of the light-emitting structure, the first leaky guided mode having a first mode frequency approximately equal to the first selected frequency emitted by the active region and a first mode wavevector that is approximately equal to a reciprocal lattice vector of the first photonic grating, wherein the light-emitting structure comprises a first light-emitting structure that includes the active region designed to emit electromagnetic radiation at the first selected frequency and a second light-emitting structure designed to emit electromagnetic radiation at a second selected frequency; and
  at least a second photonic grating positioned between the light-emitting structure and the first photonic grating, the at least a second photonic grating capable of supporting a second leaky guided mode that extends within the second light-emitting structure, the second leaky guided mode having a second mode frequency approximately equal to the second selected frequency emitted by the active region and a second mode wavevector that is approximately equal to a reciprocal lattice vector of the at least a second photonic grating.

2. The light-emitting device of claim 1 wherein the light-emitting structure comprises one of:
  an inorganic light-emitting diode that includes the active region; and
  an organic light-emitting diode that includes the active region.

3. The light-emitting device of claim 1 wherein first photonic grating is configured as a one-dimensional photonic grating.

4. The light-emitting device of claim 1 wherein first photonic grating is configured as a two-dimensional photonic grating.

5. The light-emitting device of claim 1 wherein the first photonic grating has a thickness less than a corresponding wavelength of the first selected frequency.

6. The light-emitting device of claim 1 wherein the first leaky guided mode increases the rate of spontaneous emission from the active region at the first selected frequency.

7. The light-emitting device of claim 1 wherein the first photonic grating is spaced from the active region a distance of about 1 μm or more.

8. The light-emitting device of claim 1 wherein the first photonic grating is configured so that the first leaky guided mode is capable of coupling to a radiative mode having a wavevector substantially perpendicular to a plane of periodicity of the first photonic grating.

9. The light-emitting, device of claim 1 wherein the first photonic grating has a lattice parameter that is approximately equal to a corresponding wavelength of the first selected frequency.

10. The light-emitting device of claim 1 wherein the first selected frequency is a dominant frequency of an electromagnetic spectrum emitted by the active region.

11. The light-emitting device of claim 1 wherein:
  the light-emitting structure comprises an organic light-emitting diode;
  the first photonic grating is spaced from the active region a distance of about 1 μm or more, and a thickness of the first photonic grating is less than a corresponding wavelength of the first selected frequency; and the first leaky guided mode increases the rate of spontaneous emission from the active region of the organic light-emitting diode at the first selected frequency.

12. The light-emitting device of claim 1 wherein the second photonic grating is configured so that the second leaky guided mode is capable of coupling to a radiative mode having a wavevector substantially perpendicular to a plane of periodicity of the second photonic grating.

13. A light-emitting apparatus, comprising:
a first light-emitting device comprising:
   a first light-emitting structure including a first active region designed to emit electromagnetic radiation having a first frequency; and
   a first photonic grating spaced from the first active region of the first light-emitting structure and capable of supporting a first leaky guided mode that extends within the first active region of the first light-emitting structure, the first leaky guided mode having a first mode frequency approximately equal to the first frequency emitted by the active region and a first mode wavevector that is approximately equal to a reciprocal lattice vector of the first photonic grating; and
a second light-emitting device spaced from the first light-emitting device, the second light-emitting device comprising:
   a second light-emitting structure including a second active region designed to emit electromagnetic radiation having a second frequency; and
   a second photonic grating spaced from the second active region of the second light-emitting structure and capable of supporting a second leaky guided mode that extends within the second active region of the second light-emitting structure, the second leaky guided mode having a second mode frequency approximately equal to the second frequency emitted by the active region and a second mode wavevector that is approximately equal to a reciprocal lattice vector of the second photonic grating, the second photonic grating and the second light-emitting structure configured to transmit at least a portion of the electromagnetic radiation at the first frequency.

14. The light-emitting apparatus of claim 13, further comprising:
a third light-emitting device comprising:
   a third light-emitting structure including a third active region designed to emit electromagnetic radiation having a third frequency; and
   a third photonic grating spaced from the third active region of the third light-emitting structure and capable of supporting a third leaky guided mode that extends within the third active region of the third light-emitting structure, the third leaky guided mode having a third mode frequency approximately equal to the third frequency emitted by the active region and a third mode wavevector that is approximately equal to a reciprocal lattice vector of the third photonic grating, the third photonic grating and the third light-emitting structure configured to transmit at least a portion of the electromagnetic radiation at the first and the second frequencies.

15. The light-emitting apparatus of claim 14 wherein each of the first, second, and third light-emitting structures comprises an organic light-emitting diode.

16. The light-emitting apparatus of claim 13 wherein:
the first leaky guided mode increases the rate of spontaneous emission from the first active region at the first frequency; and
the second leaky guided mode increases the rate of spontaneous emission from the second active region at the second frequency.

* * * * *

UNITED STATES PATENT AND TRADEMARK OFFICE
CERTIFICATE OF CORRECTION

| | | |
|---|---|---|
| PATENT NO. | : 7,808,005 B1 | Page 1 of 1 |
| APPLICATION NO. | : 11/789872 | |
| DATED | : October 5, 2010 | |
| INVENTOR(S) | : David A. Fattal et al. | |

It is certified that error appears in the above-identified patent and that said Letters Patent is hereby corrected as shown below:

In column 10, line 56, in Claim 9, delete "light-emitting," and insert -- light-emitting --, therefor.

Signed and Sealed this
Twenty-ninth Day of March, 2011

David J. Kappos
*Director of the United States Patent and Trademark Office*